(12) United States Patent
Seetharaman et al.

(10) Patent No.: US 6,894,568 B2
(45) Date of Patent: May 17, 2005

(54) TRANSIMPEDANCE AMPLIFIER WITH RECEIVE SIGNAL STRENGTH INDICATOR

(75) Inventors: Shivakumar Seetharaman, San Diego, CA (US); Kursad Kiziloglu, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/645,003

(22) Filed: Aug. 20, 2003

(65) Prior Publication Data

US 2005/0040892 A1 Feb. 24, 2005

(51) Int. Cl.[7] .............................. H03F 3/08; H03F 1/02
(52) U.S. Cl. .......................................... 330/308; 330/9
(58) Field of Search ............................ 330/308, 9, 73

(56) References Cited

U.S. PATENT DOCUMENTS

| 5,923,454 | A |   | 7/1999 | Eastmond et al. |
|---|---|---|---|---|
| 6,084,478 | A |   | 7/2000 | Mayampurath |
| 6,141,169 | A | * | 10/2000 | Pietruszynski et al. ....... 360/67 |
| 6,583,671 | B2 | * | 6/2003 | Chatwin ...................... 330/279 |
| 6,657,488 | B1 | * | 12/2003 | King et al. .................... 330/9 |
| 2002/0092972 | A1 |   | 7/2002 | Ames et al. |
| 2003/0066947 | A1 |   | 4/2003 | Alwan et al. |
| 2003/0098407 | A1 |   | 5/2003 | Ames et al. |
| 2004/0119477 | A1 | * | 6/2004 | Kazemi-Nia ................ 324/500 |
| 2004/0196105 | A1 | * | 10/2004 | Filip .......................... 330/308 |

OTHER PUBLICATIONS

Maxim, 10Gbps, 3.3V Low–Power Transimpedance Amplifier with RSSI, MAX3970, Rev. 2; 2002, 10 Pages.
PCT Search Report for PCT/US2004/026258, (2004), 12 pages.

* cited by examiner

*Primary Examiner*—Patricia Nguyen
(74) *Attorney, Agent, or Firm*—Grossman, Tucker, Perreault & Pfieger, PLLC; Edmund P. Pflieger

(57) ABSTRACT

Described is an apparatus comprising a transimpedance amplifier to receive an input current from a photodiode and provide an output voltage at first and second differential output terminals. A receive signal strength indicator may generate a differential receive signal strength indication (RSSI) signal based, at least in part, upon a voltage across the first and second differential output terminals.

20 Claims, 5 Drawing Sheets

TRANSIMPEDANCE AMPLIFIER WITH RECEIVE SIGNAL STRENGTH INDICATOR

BACKGROUND

The subject matter disclosed herein relates to U.S. patent application Ser. Nos. 10/074,099 and 10/074,397, filed on Feb. 11, 2002, and U.S. patent application Ser. Nos. 10/325,048; 10/325,026; 10/324,999 and 10/324,983 filed on Dec. 20, 2002.

1. Field

The subject matter disclosed herein relates to data communication systems. In particular, embodiments disclosed herein relate to processing data received from an optical transmission medium.

2. Information

Optical communication networks have been implemented to enable increased data rates in links providing point to point communication. For example, optical communication links are typically implemented in Synchronous Optical Network/Synchronous Digital Hierarchy (SONET/SDH) and 10 Gigabit Ethernet systems. At a receiving end of such an optical communication link, a receiving module typically comprises a photodiode to generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal. The photodiode and TIA are typically formed in distinct component where each component is provided with a distinct power supply.

A receiving module may also comprise a receive signal strength indicator (RSSI) to generate an RSSI signal representing the strength of an optical signal detected by a receiving photodiode. Such an RSSI signal is typically used for alignment of an optical fiber with respect to the photodiode to achieve optimal detection of the optical signal at the photodiode. Circuitry for generating an RSSI signal typically includes a circuit coupled directly to a photodiode independently of a TIA that may be used for processing signals from the photodiode. An RSSI signal is typically generated as a single-ended signal output signal having a voltage representing a strength of a detected optical signal where the voltage of the single-ended output signal is referenced to a common node of a circuit topology (e.g., a ground node).

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
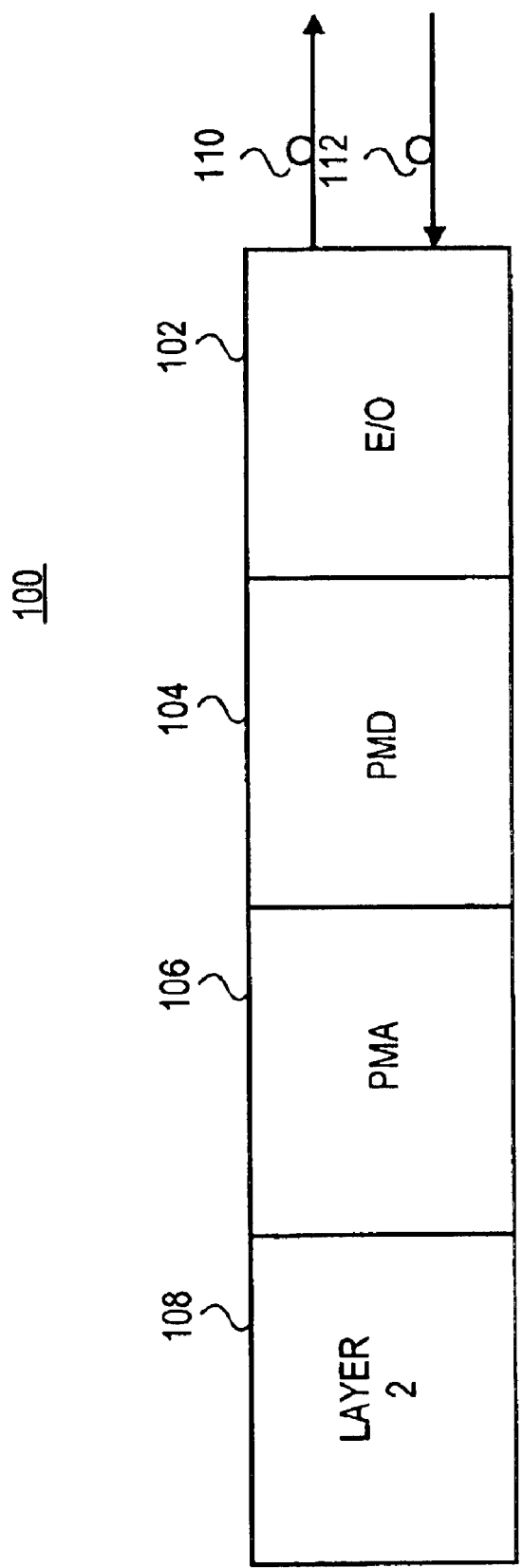
FIG. 1 shows a schematic diagram of a system to transmit data in and receive data from an optical transmission medium according to an embodiment of the present invention.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

A "photodiode" as referred to herein relates to a device that provides an output current in response to light energy collected on a surface. For example, a photodiode may provide an output current in response to charge collected at a photodiode gate. However, this is merely an example of a photodiode and embodiments of the present invention are not limited in this respect.

An "amplifier" as referred to herein relates to a device or circuit to convert an input signal to an amplified output signal. For example, an amplifier may provide an amplified output signal having a magnitude that is related to a magnitude of an input signal by an amplification gain. In another example, an amplifier may generate a voltage signal having a magnitude related by an amplification gain to a magnitude of either a current or voltage received as an input signal. However, these are merely examples of an amplifier and embodiments of the present invention are not limited in these respects.

A "transimpedance amplifier" (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in these respects.

A "single-ended signal" as referred to herein relates to a signal that may be transmitted in a single conducting terminal. A single ended signal may comprise a current signal having a magnitude that is modulated by information. Alternatively, a single ended signal may comprise a voltage signal having a magnitude that is modulated by information. For example, a single-ended signal may transmit a voltage signal having a magnitude that is referenced to a common reference node in a circuit topology such as a ground node. However, these are merely examples of a single-ended signal and embodiments of the present invention are not limited in these respects.

A "differential signal" as referred to herein relates to a signal that may be transmitted over a pair of conducting terminals. A differential signal may comprise a voltage signal having a magnitude that is modulated by information. For example, a differential signal may comprise a voltage signal across (e.g., voltage difference between) a pair of conducting terminals where a voltage at either terminal may deviate in opposite phase from a common reference voltage node in a circuit topology. However, these are merely examples of a differential signal and embodiments of the present invention are not limited in these respects.

A "single-ended terminal" as referred to herein relates to an electrical terminal to transmit or receive a single-ended signal. For example, single-ended terminal may receive a signal as an input signal. However, this is merely an example of a single-ended terminal and embodiments of the present invention are not limited in this respect.

"Differential terminals" as referred to herein relates to a pair of electrical terminals that may receive or transmit a differential signal. For example, differential terminals signal may express a signal as a voltage difference between the terminals. However, this is merely an example of differential terminals and embodiments of the present invention are not limited in this respect.

A "DC signal component" as referred to herein relates to a signal component in an electrical signal that is substantially constant over a time period. For example, such a DC signal component may be characterized as being a "DC voltage component" having a constant voltage over the time period or as being a "DC current component" having a constant DC current over the time period. However, these are merely examples of a DC signal component and embodiments of the present invention are not limited in these respects.

An "AC signal component" as referred to herein relates to a signal component in an electrical signal that fluctuates over a time period. For example, such an AC signal component may be characterized as being an "AC voltage component" having a voltage that fluctuates over the time period or as being an "AC current component" having a current that fluctuates over the time period. However, these are merely examples of an AC signal component and embodiments of the present invention are not limited in these respects.

A "composite signal" as referred to herein relates to a signal that may be characterized as having a plurality of signal components combined together. For example, a composite signal may comprise a DC signal component added to an AC signal component. However, this is merely an example of a composite signal and embodiments of the present invention are not limited in this respect.

"DC signal removal circuit" as referred to herein relates to a circuit to substantially remove all or a portion of a DC signal component from a composite signal. For example, a DC signal removal circuit may substantially remove all or a portion of a DC signal component from a composite signal having a DC signal component and an AC signal component, resulting in an isolated AC signal component. However, this is merely an example of a DC signal removal circuit and embodiments of the present invention are not limited in this respect.

A "receive signal strength indication (RSSI) signal" as referred to herein relates to a signal that represents the strength of a signal received from a transmission medium. For example, an RSSI signal may represent the strength of one or more components of an optical signal received from an optical transmission medium. Such an RSSI signal may express the strength of the received signal as a magnitude in voltage or current. However, these are merely examples of an RSSI signal and embodiments of the present invention are not limited in these respects.

Briefly, an embodiment of the present invention relates to an apparatus comprising a transimpedance amplifier to receive an input current from a photodiode, and first and second differential output terminals to provide an output voltage. A receive signal strength indicator may generate a differential receive signal strength indication (RSSI) signal based, at least in part, upon a voltage across the first and second differential output terminals. However, this is merely an example embodiment and other embodiments of the present invention are not limited in these respects.

FIG. 1 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple "lanes" of data in the optical transmission medium.

A physical medium dependent (PMD) section 104 may provide circuitry, such as a TIA (not shown) and/or limiting amplifier (LIA) (not shown), to receive and condition an electrical signal from the optical transceiver 102 in response to the received optical signal 112. The PMD section 104 may also provide power from a laser driver circuit (not shown) to a laser device (not shown) in the optical transceiver 102 for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std.802.3ae-2002, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classification device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 2:
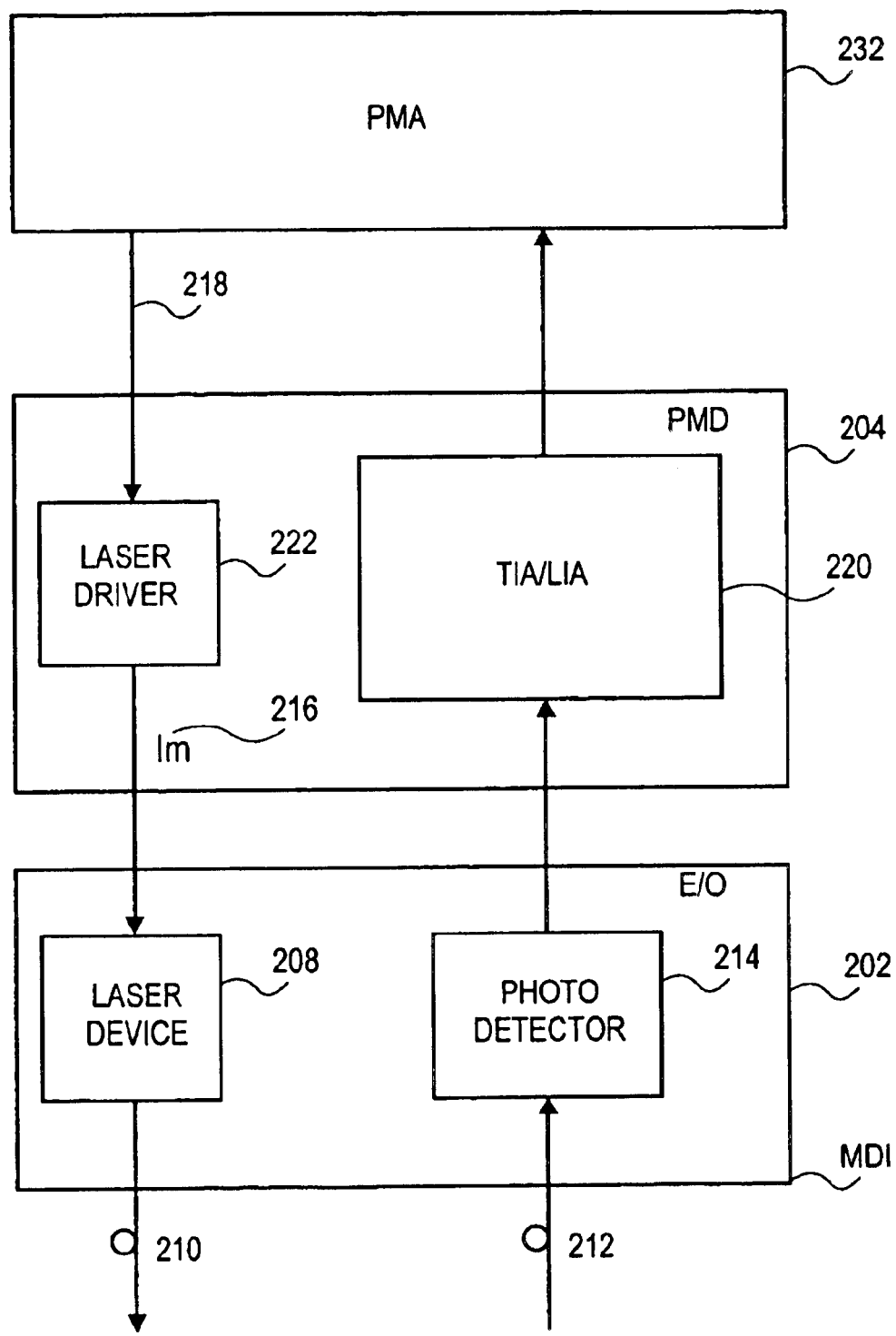
FIG. 2 shows a schematic diagram of physical medium attachment (PMA) and physical medium dependent (PMD) sections of a data transmission system according to an embodiment of the system shown in FIG. 1.

FIG. 2 shows a schematic diagram of a system 200 to transmit data in and receive data from an optical transmission medium according to an embodiment of the system shown in FIG. 1. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a transimpedance amplifier/limiting amplifier (TIA/LIA) circuit 220. A laser driver circuit 222 may modulate a modulation current 216 in response to a data signal from a PMA section 232. A laser device 208 may then modulate and power the transmitted optical signal 210 in response to the modulation current 216.

According to an embodiment, the photo detector section 214 may provide a composite signal to the TIA/LIA circuit 220 comprising AC and DC signal components. For example, an input signal received at a TIA portion may comprise an AC current component and a DC current component while an input received at a LIA portion may comprise an AC voltage component and a DC voltage component.

Figure 3:
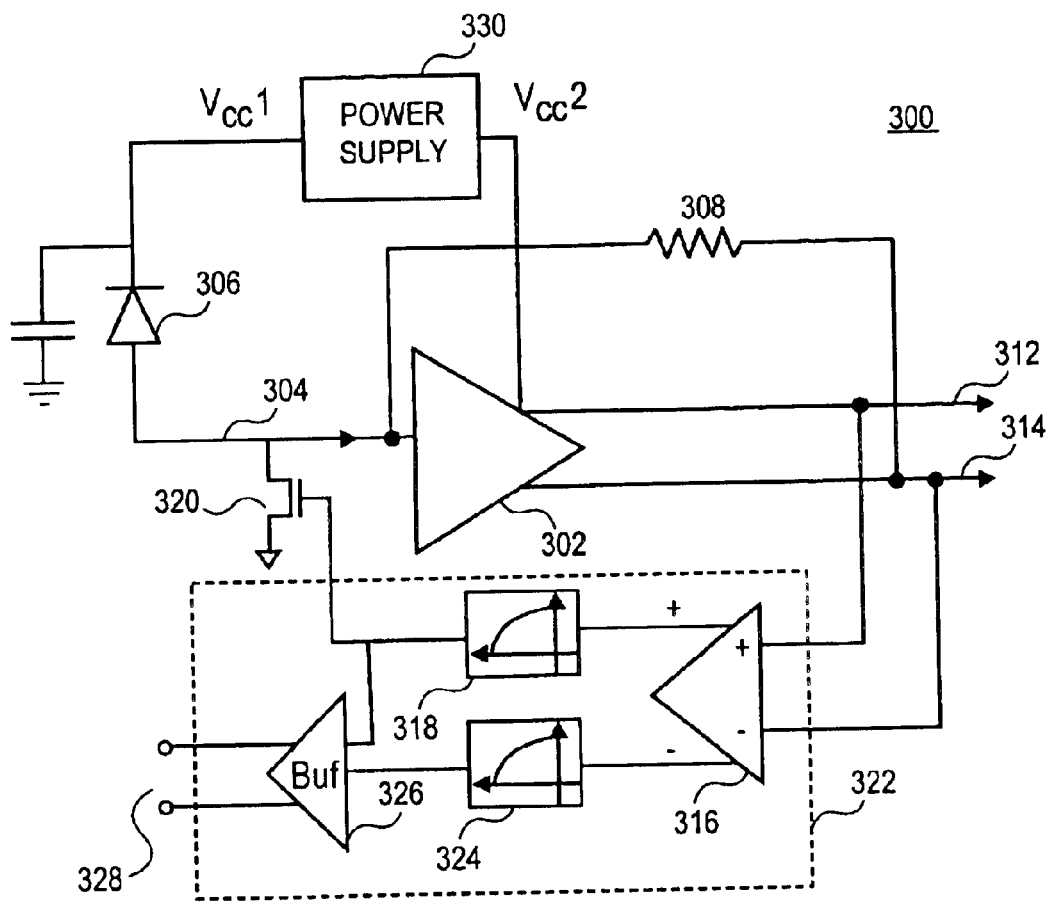
FIG. 3 shows a schematic diagram of a system to generate a receive signal strength indication signal according to an embodiment of the PMD section shown in FIG. 2.

FIG. 3 shows a schematic diagram of a TIA 300 according to an embodiment of the PMD section 204 shown in FIG. 2 incorporating a receive signal strength indicator 322 to generate an RSSI signal in response to receipt of an optical signal on a photodiode 306. An amplifier 302 may receive a single-ended input 304 from a photodiode 306 which is responsive to an optical data signal and provides a differential output voltage at output terminals 312 and 314. The TIA 300 may be formed as part of an integrated device (e.g., as part of a single device including the TIA 300 and other portions of the PMD section) in a semiconductor process such as a complementary metal oxide semiconductor (CMOS) manufacturing process. However, this is merely an example of a process that may be used to form a TIA and embodiments of the present invention are not limited in this respect.

Figure 4:
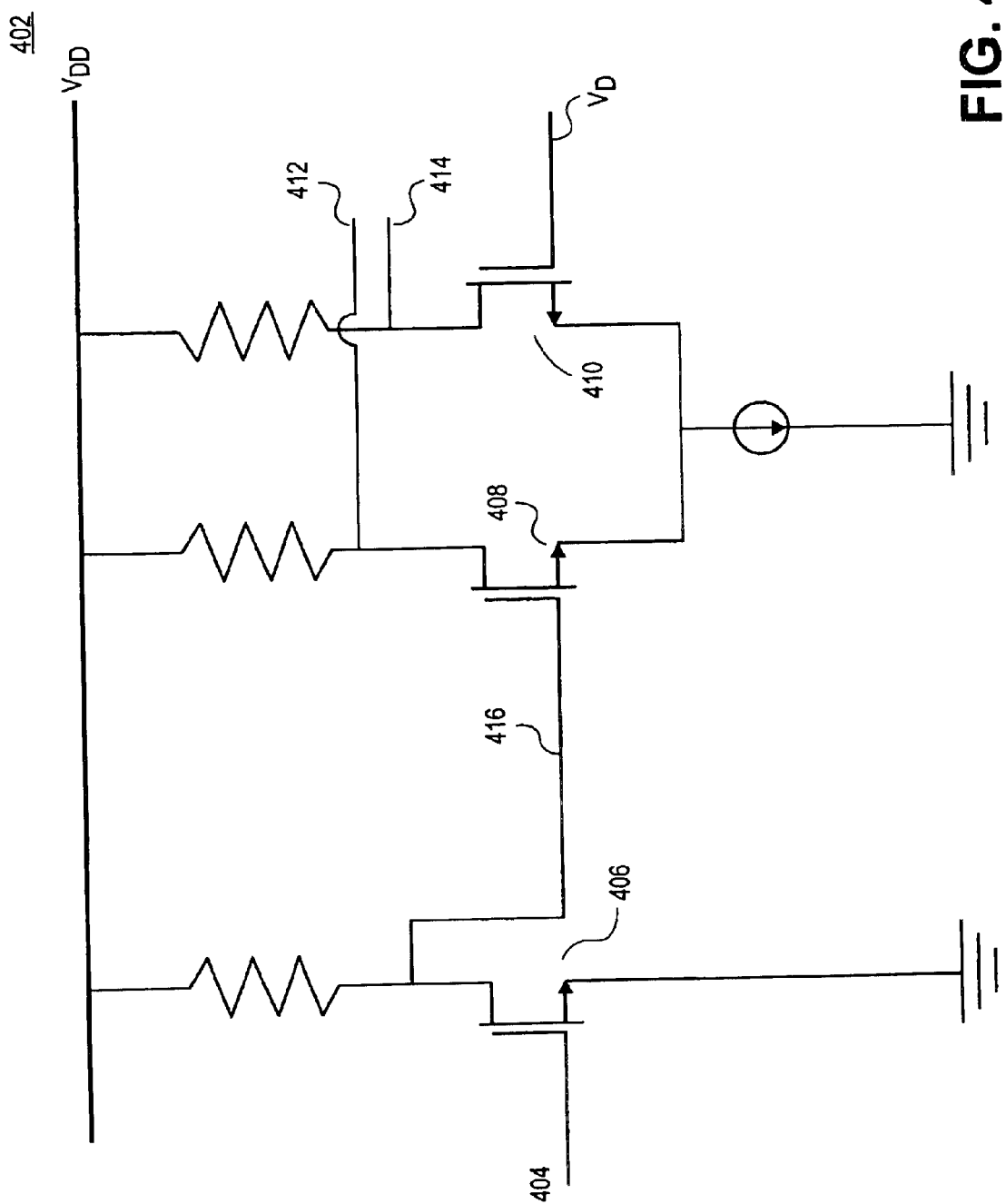
FIG. 4 shows a schematic diagram of a multistage amplifier according to an embodiment of a transimpedance amplifier shown in either FIG. 3.

FIG. 4 shows a schematic diagram of an amplifier 402 according to an embodiment of the amplifier 302 shown in FIG. 3. A first amplification stage comprises a transistor 406. A gate of the transistor 406 may receive a single ended input signal on a single-ended input terminal 304 from the photodiode 306. In response to the input signal, a second amplification stage comprising a differential amplifier formed by transistors 408 and 410 may provide an output voltage on differential output terminals 412 and 414. In an alternative embodiment, the amplifier 402 may comprise a multi-stage topology as described in U.S. patent application Ser. No. 10/074,099 filed on Feb. 11, 2002. However, these are merely examples of a multi-stage amplifier that may be implemented in a TIA and embodiments of the present invention are not limited in these respects.

According to an embodiment of the TIA 300 shown in FIG. 3, the input signal 304 comprises an AC current component and a DC current component. Output terminals 312 and 314 may generate a voltage which is representative of the magnitude of the composite AC and DC current components of the input signal 304. In the illustrated embodiment, the voltage from the output terminals 312 and 314 may have a magnitude that is substantially proportional to a magnitude of the composite AC and DC current component.

An amplifier 3) 6 may receive a voltage from the output terminal 312 at a non-inverting input and receive a voltage from the output terminal 314 at an inverting input. Low pass filters (LPFs) 318 and 324 may each receive an output voltage from the amplifier 316 where the inputs to each of the LPFs 318 and 324 have a voltage difference that is substantially an amplification of the voltage difference between the output terminals 312 and 314. According to an embodiment, the LPFs 318 and 324 may substantially remove a portion of the amplified voltage difference (between output to terminals 312 and 314) which is representative of the AC current component to isolate the portion of the amplified voltage which is representative of the DC current component. The LPFs 318 and 324 may also remove portions of noise added by the amplifier 316 in providing the amplified voltages. The output of the LPF 318 (comprising the isolated portion of the amplified voltage which is representative of the DC current component) may be provided to a sink transistor 320 to substantially remove all or a portion of the DC current component from the input signal 304.

According to an embodiment, a buffer circuit 326 may receive the outputs of the LPFs 318 and 324 as a differential voltage signal which may be representative of the magnitude of the DC current component of the input signal 304. In response, the buffer circuit 326 may generate a differential RSSI signal on differential terminals 328 where the differential RSSI signal comprises a voltage that is representative of the strength of the DC current component of the input signal 304. By providing the RSSI signal as a differential signal, many sources of noise can be eliminated over designs which provide an RSSI signal as a single-ended output signal. Such noise sources may include, for example, power supplies, parasitics of bond wire and power lines on-chip, impedance mismatches and variations in devices that may be introduced at any circuit node between a single-ended output terminal generating the single-ended RSSI signal a reference node (e.g., ground). In the embodiment illustrated with reference to FIG. 3, on the other hand, to the extent that the multi-stage amplifier 302, amplifier 316 or LPFs 318 may introduce noise to the voltage at either of the differential output terminals 328, these noise sources may equally affect the individual signals provided at each of the differential output terminals 328. Accordingly, the resulting differential RSSI signal may substantially cancel the effects of these noise sources.

Generating an RSSI from single-ended signal typically entails using a separate power supply for both a TIA and a photodiode which introduces a separate noise source for each power supply. By generating the RSSI signal based upon the differential output signal of the TIA 300, as in the presently illustrated embodiment, a single common power supply 330 may be used for powering both the photodiode 306 and the TIA 300. Accordingly, correlated noise at each terminal of the differential output signal may be canceled.

Figure 5:
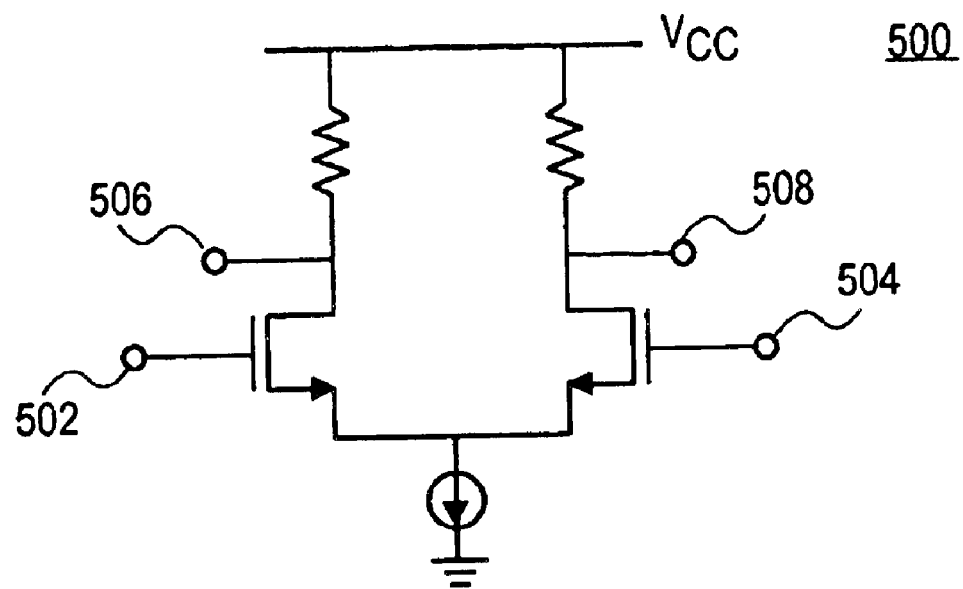
FIG. 5 shows a schematic diagram of a buffer circuit to generate a differential receive signal strength indicator signal according to an embodiment of the transimpedance amplifier shown in FIG. 3.

FIG. 5 shows a schematic diagram of a buffer circuit to generate a differential RSSI signal according to an embodiment of the buffer circuit 326 in FIG. 3. A differential amplifier circuit 500 may receive a differential input signal at differential input terminals 502 and 504. For example, the output of each of the LPFs 318 and 324 may be applied to a corresponding one of the differential input terminals 502 and 504. In response, to the differential input signal, the differential amplifier circuit 500 may generate a differential RSSI signal at differential output terminals 506 and 508.

Figure 6:
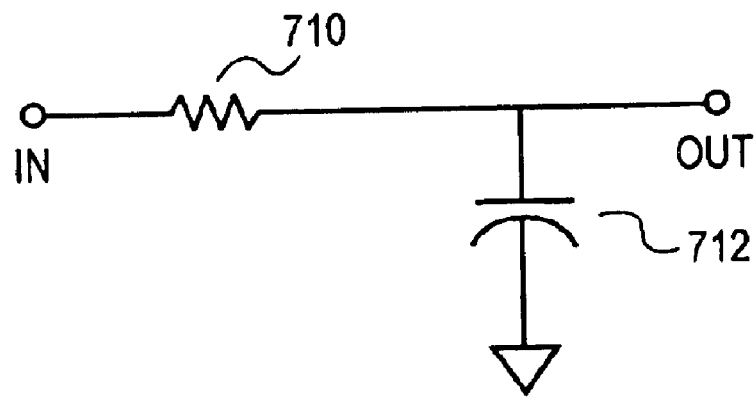
FIG. 6 shows a schematic diagram of low pass filter according to an embodiment of the transimpedance amplifier shown in FIG. 3.

FIG. 6 shows a schematic diagram of a circuit for an LPF according to an embodiment the LPF 318 or 324 shown in FIG. 3. The LPFs 318 or 324 may be any LPF formed using a resistor 710 and capacitor 712 as shown in FIG. 5. However, this is merely an example of how a LPF may be formed in a circuit and embodiments of the present invention are not limited in these respects.

While there has been illustrated and described what are presently considered to be example embodiments of the present invention, it will be understood by those skilled in the an that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A system comprising:
   a photodiode;
   a transimpedance amplifier comprising an input terminal to receive an input current from the photodiode, and first and second differential output terminals to provide an output voltage;
   a receive signal strength indicator to generate a differential receive signal strength indication (RSSI) signal based, at least in part, upon the output voltage;
   a data recovery circuit to provide a serial data signal in response to the output voltage; and
   a deserializer to provide a parallel data signal in response to the serial data signal.

2. The system of claim 1, the system further comprising a SONET framer to receive the parallel data signal.

3. The system of claim 2, wherein the system further comprises a switch fabric coupled to the SONET framer.

4. The system of claim 1, the system further comprising an Ethernet MAC to receive the parallel data signal at a media independent interface.

5. The system of claim 4, wherein the system further comprises a multiplexed data bus coupled to the Ethernet MAC.

6. The system of claim 4, wherein the system further comprises a switch fabric coupled to the Ethernet MAC.

7. The system of claim 1, wherein the input current comprises a DC current component and an AC current component, the apparatus further comprising a DC offset cancellation circuit to substantially remove at least a portion of the DC signal component from the input terminal based, at least in part, on the output voltage.

8. The system of claim 1, wherein the input current comprises a DC current component and an AC current component, and wherein the RSSI signal comprises a voltage that is substantially proportional to a magnitude of the DC current component.

9. The system of claim 1, the apparatus further comprising:
   at least one low pass filter to provide a differential voltage signal in response to the output voltage; and
   a buffer circuit to generate the differential RSSI signal in response to the differential voltage signal.

10. The system of claim 9, wherein the buffer circuit comprises a differential amplifier to generate the differential RSSI signal in response to the differential voltage signal.

11. An apparatus comprising:
    a transimpedance amplifier comprising an input terminal to receive an input current from a photodiode, and first and second differential output terminals to provide an output voltage;
    a receive signal strength indicator to generate a differential receive signal strength indication (RSSI) signal based, at least in part, upon the output voltage.

12. The apparatus of claim 11, wherein the input current comprises a DC current component and an AC current component, the apparatus further comprising a DC offset cancellation circuit to substantially remove at least a portion of the DC signal component from the input terminal based, at least in part, on the output voltage.

13. The apparatus of claim 11, wherein the input current comprises a DC current component and an AC current component, and wherein the RSSI signal comprises a voltage that is substantially proportional to a magnitude of the DC current component.

14. The apparatus of claim 11, the apparatus further comprising:
    at least one low pass filter to provide a differential voltage signal in response to the output voltage; and
    a buffer circuit to generate the differential RSSI signal in response to the differential voltage signal.

15. The apparatus of claim 14, wherein the buffer circuit comprises a differential amplifier to generate the differential RSSI signal in response to the differential voltage signal.

16. A method comprising:
    receiving an input current from a photodiode at an input terminal of a transimpedance amplifier;
    generating an output voltage at first and second differential output terminals of the transimpedance amplifier in response to the input current; and
    generating a differential receive signal strength indication (RSSI) signal based, at least in part, upon the output voltage.

17. The method of claim 16, wherein the input current comprises a DC current component and an AC current component, the method further comprising substantially removing at least a portion of the DC signal component from the input terminal based, at least in part, on the output voltage.

18. The method of claim 16, wherein the input current comprises a DC current component and an AC current component, and wherein the RSSI signal comprises a voltage that is substantially proportional to a magnitude of the DC current component.

19. The method of claim 16, the method further comprising:
    receiving the output voltage at by least one low pass filter
    generating a differential voltage signal in response to receipt of the output voltage;
    receiving the differential voltage signal at a buffer circuit; and
    generate the differential RSSI signal at the buffer circuit in response to the differential voltage signal.

20. The method of claim 19, wherein the buffer circuit comprises a differential amplifier to generate the differential RSSI signal in response to the differential voltage signal.

* * * * *

UNITED STATES PATENT AND TRADEMARK OFFICE
CERTIFICATE OF CORRECTION

PATENT NO. : 6,894,568 B2
DATED : May 17, 2005
INVENTOR(S) : Shivakumar Seetharaman It is certified that error appears in the above-identified patent and that said Letters Patent is hereby corrected as shown below:

<u>Title page,</u>
Item [74], *Attorney, Agent, or Firm*, after "Perreault &" delete "Pfieger" and insert -- Pfleger --, therefor.
After "Edmund P." delete "Pflieger" and insert -- Pfleger --, therefor.

Signed and Sealed this

Sixth Day of September, 2005

JON W. DUDAS
*Director of the United States Patent and Trademark Office*